(12) United States Patent  (10) Patent No.:  US 8,829,918 B2
Sylvester et al.  (45) Date of Patent:  Sep. 9, 2014

(54) DIE CONNECTION MONITORING SYSTEM AND METHOD

(75) Inventors: Jeffry S. Sylvester, Tomball, TX (US); Richard H. Hodge, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 455 days.

(21) Appl. No.: 13/203,748

(22) PCT Filed: Apr. 30, 2009

(86) PCT No.: PCT/US2009/042230
§ 371 (c)(1),
(2), (4) Date: Aug. 29, 2011

(87) PCT Pub. No.: WO2010/126511
PCT Pub. Date: Nov. 4, 2010

(65) Prior Publication Data
US 2012/0001642 A1  Jan. 5, 2012

(51) Int. Cl.
*G01R 31/04* (2006.01)
*H01L 21/66* (2006.01)
*H01L 23/50* (2006.01)
*G01R 31/02* (2006.01)

(52) U.S. Cl.
CPC .............. *H01L 23/50* (2013.01); *H01L 22/32* (2013.01); *H01L 2224/16225* (2013.01); *H01L 2924/15311* (2013.01); *G01R 31/048* (2013.01); *G01R 31/026* (2013.01)

USPC ................. 324/538; 324/757.04; 324/750.24

(58) Field of Classification Search
USPC ............ 324/538, 691, 750.24, 754.1, 754.11, 324/757.04
See application file for complete search history.

(56) References Cited

U.S. PATENT DOCUMENTS

| | | | |
|---|---|---|---|
| 6,097,203 A | 8/2000 | Parker et al. | |
| 6,452,502 B1 | 9/2002 | Dishongh et al. | |
| 6,564,986 B1 | 5/2003 | Hsieh | |
| 7,394,273 B2 | 7/2008 | Hsu et al. | |
| 2002/0017707 A1 | 2/2002 | Suenaga et al. | |
| 2004/0245996 A1 | 12/2004 | Barr et al. | |
| 2004/0249612 A1 | 12/2004 | Barr et al. | |
| 2006/0191889 A1 | 8/2006 | Hofmeister et al. | |
| 2006/0194353 A1 | 8/2006 | Spuhler et al. | |
| 2007/0024271 A1 | 2/2007 | Azimi et al. | |
| 2007/0252612 A1 | 11/2007 | Sylvester | |
| 2007/0296068 A1 | 12/2007 | Schnetker | |
| 2008/0144243 A1 | 6/2008 | Mariani et al. | |

*Primary Examiner* — Vincent Q Nguyen
(74) *Attorney, Agent, or Firm* — Nathan Rieth

(57) ABSTRACT

A system for monitoring a die connection includes a die bonded to a substrate and a connection indicator circuit coupled to a monitor pad of the die. The connection indicator circuit is configured to detect a connection failure of the monitor pad. A signal corresponding to the monitor pad of the die is monitored, and an indication of a pad connection failure associated with the monitor pad is provided in response to a change in the monitored signal.

15 Claims, 7 Drawing Sheets

DIE CONNECTION MONITORING SYSTEM AND METHOD

BACKGROUND

Integrated circuit design generally involves producing large numbers of integrated circuits on a single silicon wafer through processes such as photolithography. The wafers are sawn into individual chips (i.e., die) that each contain a copy of the integrated circuit. Each die, or chip, is mounted on a substrate such as a ball grid array, or "BGA". A BGA typically serves as the substrate or packaging for the die integrated circuit. A die is connected to the BGA either by wire bonding or through solder bumps on its bond pads when the die is "flip-chip" mounted. A "flip-chip" is a die that can be attached or bonded directly to a BGA in a "face-down" manner without any wire bonding. The flip-chip has pre-processed bond pads on which solder bumps are typically formed, enabling the face-down attachment of the flip-chip to contacts on the BGA through, for example, ultrasonic or reflow solder processes.

Solder joints in both flip-chip and wire-bonded die can crack due to various stresses such as cyclical mechanical and thermal loading on the BGA, the printed circuit board (PCB), and/or the die itself. Mechanical loading can be caused by vibration during transportation, for example, and thermal stresses occur during normal operation. Cracked solder joints can cause bond pads on the die to become detached or otherwise loosened from the BGA, resulting in open or intermittent electrical connections between the die integrated circuit and the BGA and/or a printed circuit board. In order to reduce the failures associated with cracked solder joints, functional bond pads are often replaced with dummy bond pads that are not used by the die integrated circuit. The dummy bond pads are typically located on the die in areas of higher stress such as corners, and/or in areas of greater temperature fluctuations. Therefore, if solder joints (either flip-chip or wire bonded) between dummy bond pads and BGA contacts become cracked, loosened, or otherwise damaged, performance of the integrated circuit on the die is not compromised.

However, damage to solder joints is not necessarily limited to the dummy solder joints in high stress areas of the die. Solder joints associated with functional bond pads can also become cracked, loosened, or otherwise damaged. For example, although a cracked solder joint may initially occur at the corner of the die, the cracking condition tends to propagate inward toward the center of the die, thereby compromising functional or non-dummy bond pads and resulting in open or intermittent electrical connections to the die integrated circuit.

Generally, these same types of stresses and damage to die solder joints also apply to solder joints between the BGA and printed circuit board. Thus, cracked and damaged solder ball joints between BGA and PCB contacts can likewise result in open or intermittent electrical connections to a die integrated circuit.

BRIEF DESCRIPTION OF THE DRAWINGS

The present embodiments will now be described, by way of example, with reference to the accompanying drawings, in which.

DETAILED DESCRIPTION

Overview of Problem and Solution

As noted above, one problem with attaching a die to an underlying substrate (e.g., a ball grid array, or "BGA") is the intermittent and/or open electrical connections that can result from cracked solder joints between the die bond pads and the BGA connection points. This problem can occur when the die is "flip-chip" mounted to the BGA or when it is wire-bonded to the BGA. This problem is likewise applicable to solder joints attaching a BGA to an underlying printed circuit board (PCB).

Embodiments of the present disclosure detect these problems using die monitoring systems and methods. For example, in one embodiment a system for monitoring a die connection includes a die bonded to a substrate such as a BGA. A connection indicator circuit is coupled to a monitor pad of the die and configured to detect a connection failure of the monitor pad. A connection failure can occur both when the monitor pad becomes uncoupled from the substrate contact and/or when the substrate contact becomes uncoupled from the underlying printed circuit board.

In another embodiment, a system for monitoring a die connection includes a die bonded to a ball grid array (BGA) where the BGA is bonded to a printed circuit board (PCB). A monitor pad on the die is coupled to ground through the BGA and further coupled to a voltage rail through a pull-up resistor on the die. A latch stores a connection failure indication of the monitor pad. A connection failure can occur when a solder joint coupling the monitor pad to a BGA contact fails, and/or when a solder joint coupling the BGA contact to a ground connection on the PCB fails, either of which causes a disruption in the ground connection.

In still another embodiment, a method of monitoring a the connection includes monitoring a signal corresponding to a monitor pad of the and providing an indicator of a pad connection failure with the monitor pad in response to a change in the signal. This method also applies where there are a number of monitor pads coupled in series by indicating a pad connection failure associated with any one or more of the monitor pads.

Illustrative Embodiments

Figure 1A:
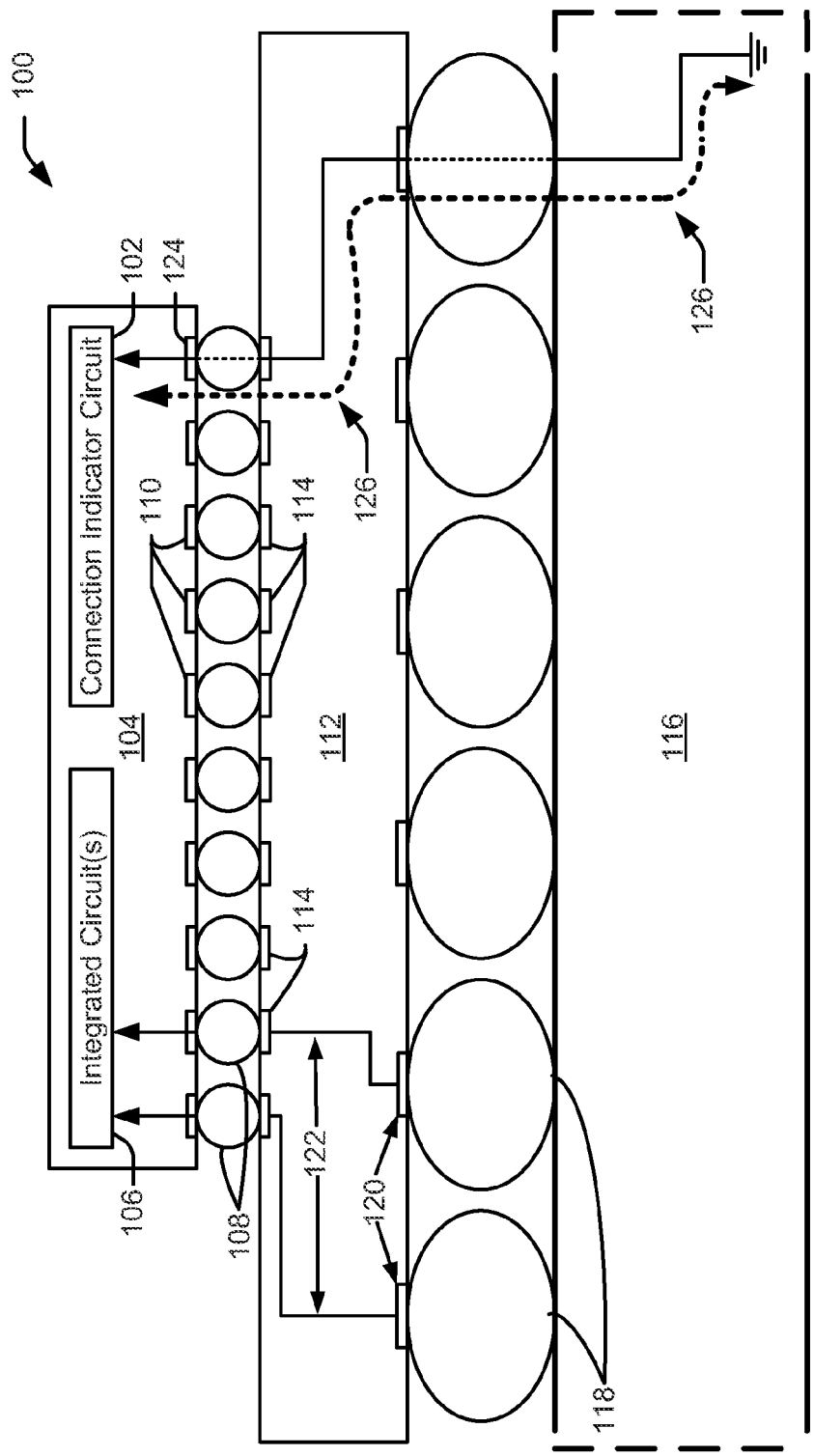
FIG. 1a shows an example of a die connection monitoring system where the die is flip-chip mounted to a substrate according to an embodiment.
Figure 1B:
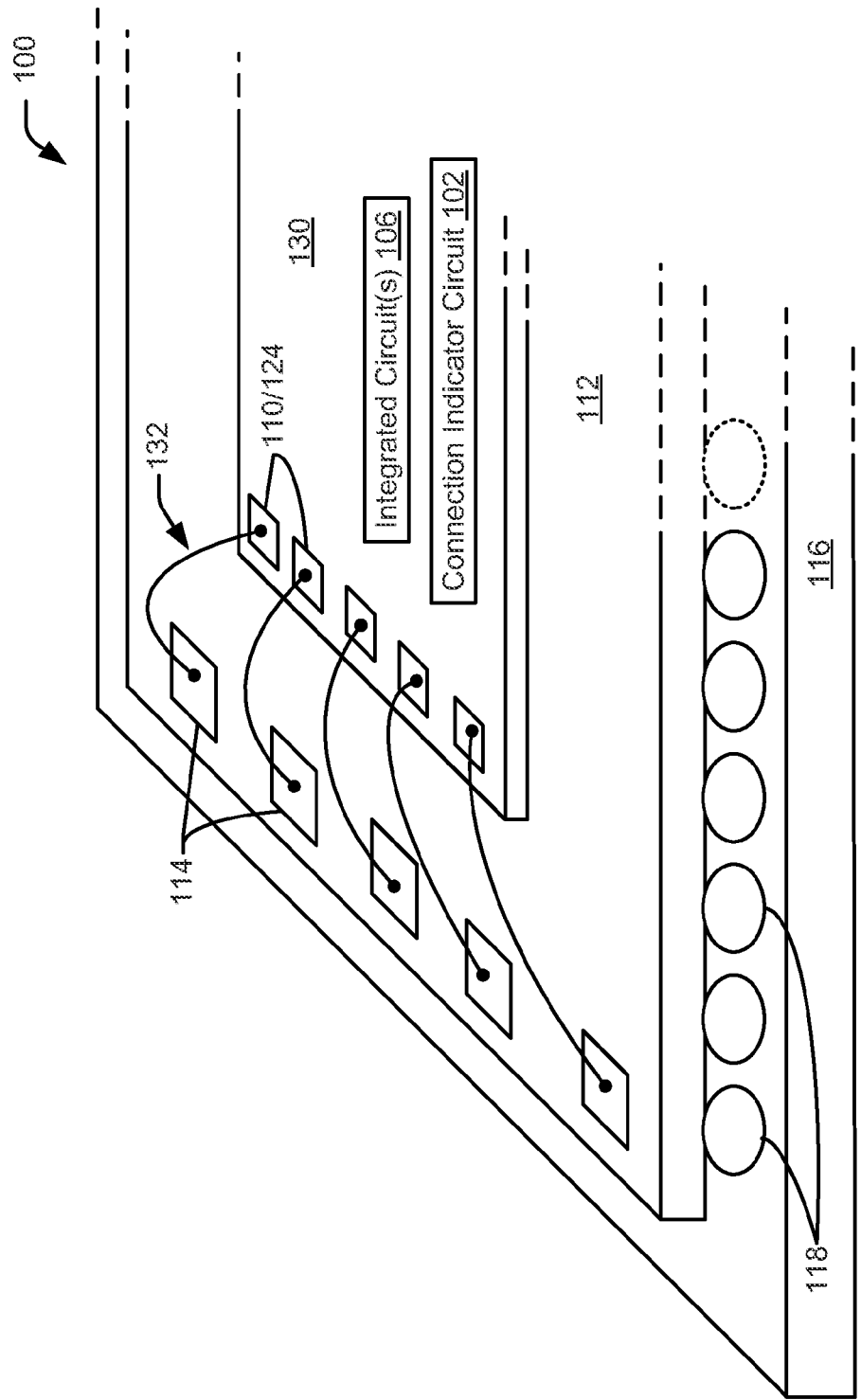
FIG. 1b shows an example of the die connection monitoring system of FIG. 1a where the die is wire-bonded to a substrate according to an embodiment.

FIG. 1a shows an example of an embodiment of a die connection monitoring system 100. The die in FIG. 1a is represented as a "flip-chip" die 104 mounted to a substrate (BGA 112). However, the die may also be a wire-bonded die 130 connected to a substrate by wire bonds 132 as shown in FIG. 1b. It is noted that although embodiments are primarily described herein with respect to flip-chip mounted die, the descriptions apply in similar fashion to wire-bonded die.

Referring to FIG. 1a, the system 100 includes a connection indicator circuit 102 disposed on a flip-chip die 104. Flip-chip 104 is a die or chip on which one or more functional integrated circuits 106 have been fabricated from semiconductor material. In addition to integrated circuit(s) 106, flip-chip 104 also includes the integrated connection indicator circuit 102 which is functionally isolated or distinct from the integrated circuit(s) 106. Solder bumps 108 deposited onto the die pads 110 (on the top side of flip-chip 104) are used to attach or bond the flip-chip 104 directly to a substrate such as ball grid array (BGA) 112. Because die pads 110 and solder bumps 108 are on the top side of flip-chip 104, the flip-chip 104 is flipped over and mounted to BGA 112 in a "face-down" manner. Solder bumps 108 couple the pads 110 to BGA contacts 114, for example, through an ultrasonic or reflow solder process.

Die connection monitoring system 100 can also include printed circuit board (PCB) 116 coupled to BGA 112 through solder balls 118. Solder balls 118 are soldered to PCB contacts 120 on BGA 112 and to the PCB 116. Each BGA contact 114 on one side of BGA 112 is typically coupled through BGA 112 by a conductive path 122 to a corresponding PCB contact 114 on the other side of BGA 112.

Die pads 110 are typically functional pads providing access to an integrated circuit 106 of the flip-chip the 104 (or wire-bonded the 130; FIG. 1b). However, in some instances, a the pad 110 may not be a functional pad associated with an integrated circuit 106 of the flip-chip 104. Instead, a the pad 110 may be a monitor pad 124 associated with the connection indicator circuit 102 of flip-chip 104. In such cases, a monitor pad 124 is coupled to the connection indicator circuit 102 and forms part of a conductive path 126 of the connection indicator circuit 102.

Figure 2:
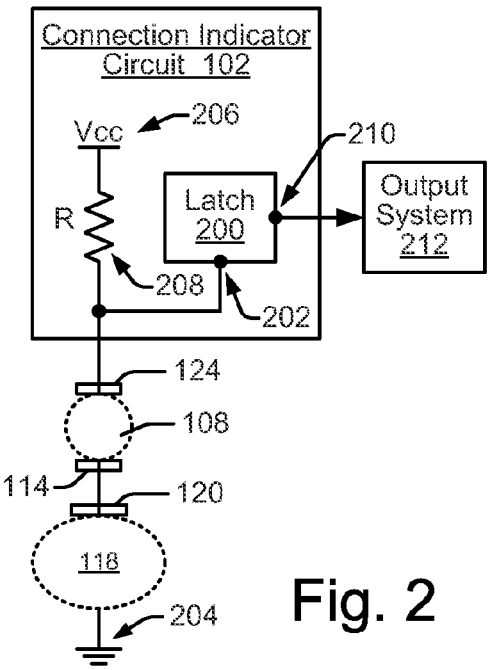
FIG. 2 shows a connection indicator circuit according to an embodiment.
Figure 3:
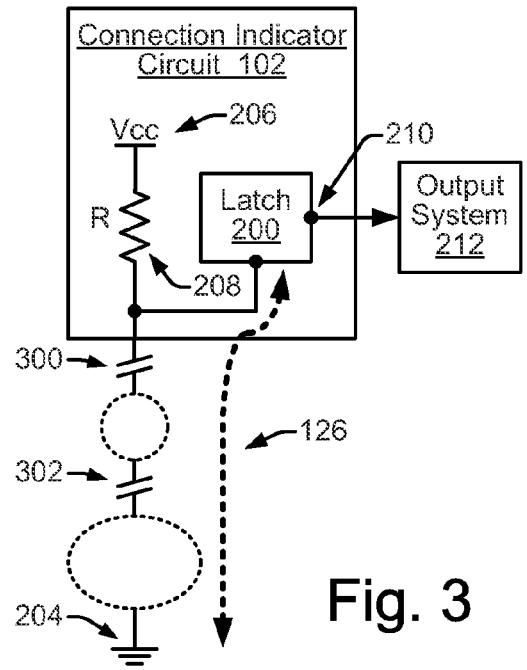
FIG. 3 shows a connection indicator circuit with example breaks in a conductive path according to an embodiment.

FIG. 2 illustrates one embodiment of a connection indicator circuit 102. This embodiment is consistent with the connection monitoring system 100 embodiment shown in FIGS. 1a and 1b, and it illustrates the case in which a single monitor pad 124 is monitored by the connection indicator circuit 102. The connection indicator circuit 102 includes a latch 200 having an input 202 coupled to ground 204 through monitor pad 124 via a conductive path 126 (FIGS. 1a and 3). Although the ground connection 204 to monitor pad 124 may originate elsewhere, in this instance the ground connection originates on the PCB 116 and is electrically coupled to monitor pad 124 and latch 200 via conductive path 126 which includes PCB 116, a solder ball 118, a PCB contact 120 on BGA 112, a BGA contact 114 on BGA 112, and a solder bump 108 on monitor pad 124.

The input 202 of latch 200 is also coupled to a voltage rail (Vcc) 206 through a pull-up resistor R 208. Latch 200 represents an electronic circuit having two stable states which enable it to store one bit of information. In general, latch 200 is a sequential logic circuit whose output 210 state depends both on a present input signal and a previous input signal. Latch 200 is configured to change its state at output 210 based on the input signal received at input 202 from monitor pad 124. An output system 212 is communicatively coupled to latch 200 for generating and/or otherwise sending a signal indicative of a pad connection failure. In the embodiments of FIGS. 1 through 7, output system 212 comprises a computer device usable during production/testing and/or otherwise to notify a customer of imminent failure of the electronics. Output system 212 may also comprise an onboard system (e.g., disposed on and/or otherwise forming part of PCB 116). A computer device representing output system 212 may also comprise a computer in which PCB 116 is installed, thereby providing a visual or other type of indication of a computer device system failure. Output system 212 may also be configured to set a flag in a flash memory of PCB 116 to facilitate logging and tracking of pad connection failures.

Referring now to both FIGS. 2 and 3, in operation, conductive path 126 is grounded at 204 such that the input signal at input 202 of latch 200 is low, or ground. If the solder joint at solder bump 108 of monitor pad 124 fails (or if a wire bond 132 fails, FIG. 1b), causing an uncoupling of the monitor pad 124 from the BGA contact 114, or in the event of an intermittent failure (e.g., the connection becomes intermittent), current will be prevented from flowing along path 126 (i.e., the circuit will open). Breaks in conductive path 126 are generally illustrated in FIG. 3 by break 300 and break 302. When the conductive path 126 to ground 204 is broken or becomes uncoupled, the input signal at input 202 of latch 200 is pulled up to the voltage rail Vcc via pull-up resistor R 208. This causes latch 200 to change its output state at output 210. The change in the output state of latch 200 indicates that a pad connection failure has occurred. The output 210 from latch 200 is sent to output system 212 (computer device) to provide a notification of a pad connection failure.

A pad connection failure may be due to a break anywhere along the conductive path 126. In the disclosed embodiments, connection indicator circuit 102 integrated onto flip-chip die 104 (or wire bonded die 130, FIG. 1b) enables the detection of a pad failure at a monitor pad 124 on the flip-chip 104 (or wire bonded die 130, FIG. 1b), as well as at any other failure along conductive path 126 of the circuit 102 which causes an uncoupling of the ground connection (complete and/or intermittent) from monitor pad 124. Thus, a pad failure may be an indication of a failure of any one or more of a break in the solder joint (i.e., solder bump) between monitor pad 124 and BGA contact 114, a break in a wire bond 132, a break in a conductive path 122 through BGA 112, a break in the solder joint (i.e., solder ball 118) between a PCB contact 120 and PCB 116, a break in the conductive path on the PCB 116, and so on.

Figure 5:
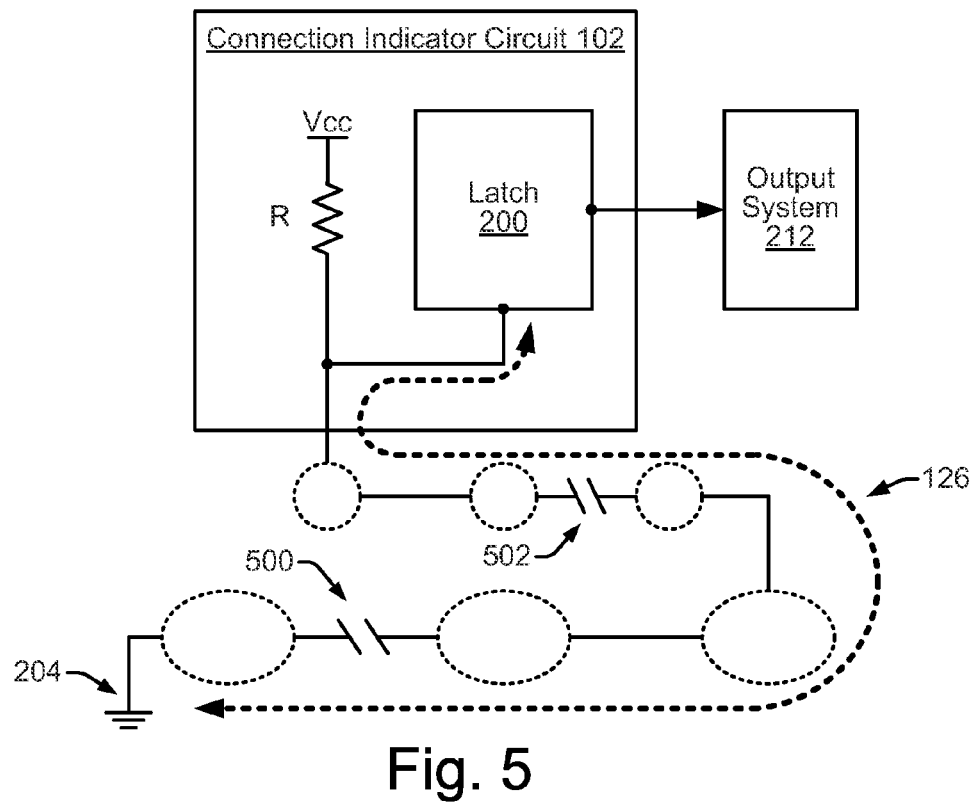
FIG. 5 shows a connection indicator circuit consistent with the die monitoring system of FIG. 4 having example breaks in a conductive path according to an embodiment.
Figure 4:
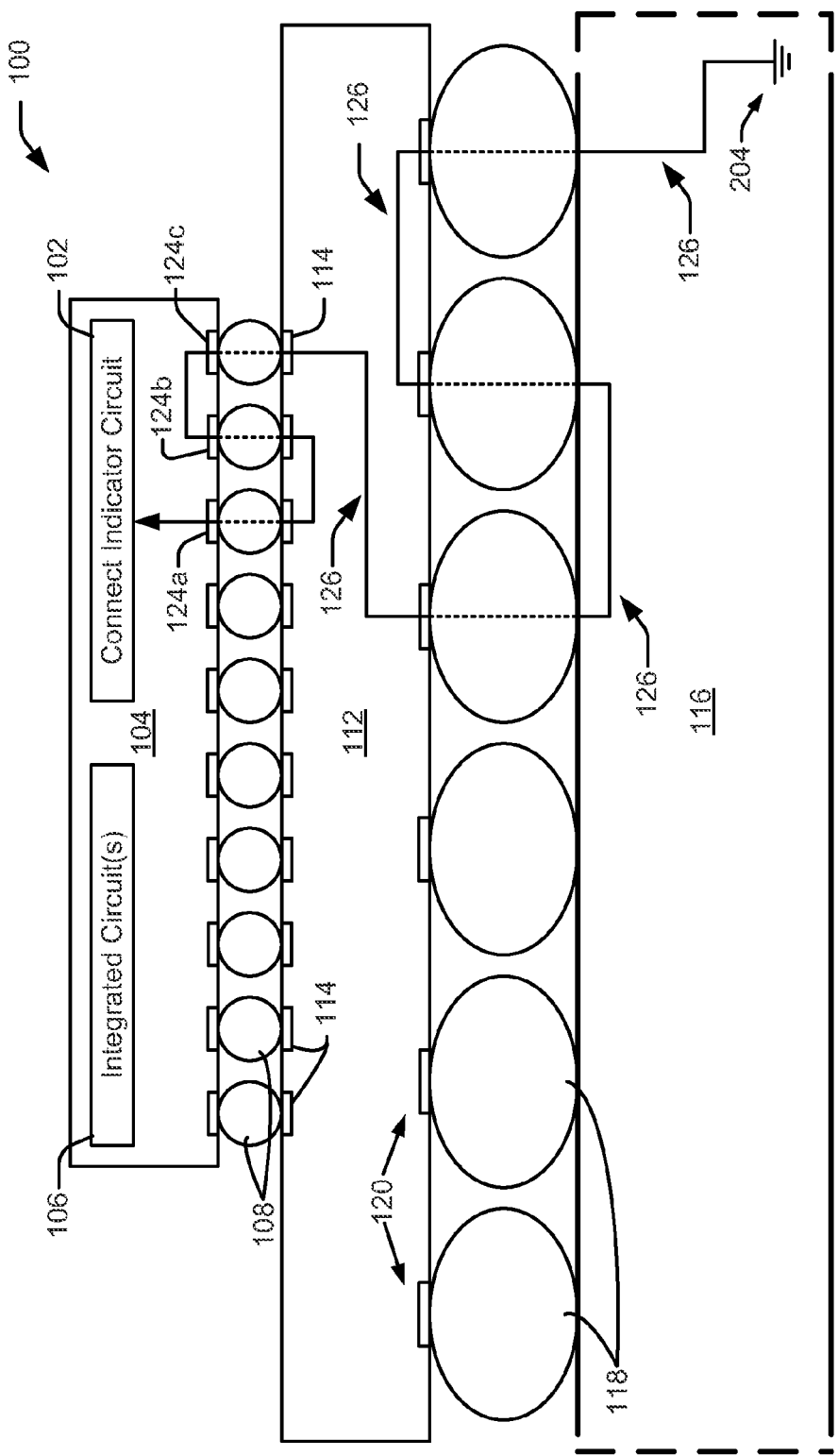
FIG. 4 shows another example of a die connection monitoring system according to an embodiment.

FIG. 4 illustrates an embodiment of a the connection monitoring system 100 in which a plurality of monitor pads 124 may be linked in series and monitored at the same time by connection indicator circuit 102 integrated onto flip-chip 104. Furthermore; the embodiment in FIG. 4 shows that a plurality of solder joints between the substrate (BGA 112) and the PCB 116 linked in series can likewise be monitored at the same time by connection indicator circuit 102. FIG. 5 shows a connection indicator circuit 102 consistent with the die monitoring system of FIG. 4 having example breaks 500 and 502 conductive path 126 according to an embodiment. As in the previous embodiment, connection indicator circuit 102 on flip-chip 104 enables the detection of a pad failure at a monitor pad 124 on the flip-chip 104, as well as at any other failure along conductive path 126 of the circuit 102 which causes an uncoupling of the ground connection (complete and/or intermittent) from monitor pad 124. Here, a pad failure may be an indication of a failure of any one or more of a break in a solder joint (i.e., solder bump 108) between monitor pads 124a, 124b, and 124c and their respective BGA contacts 114, a break in a wire bond, a break in conductive path 126 on BGA 112 between a BGA contact 114 and a PCB contact 120, a break in a solder joint (i.e., solder ball 118) along path 126 between a PCB contact 120 and PCB 116, a break in the conductive path 126 on the PCB 116, and so on.

Figure 6:
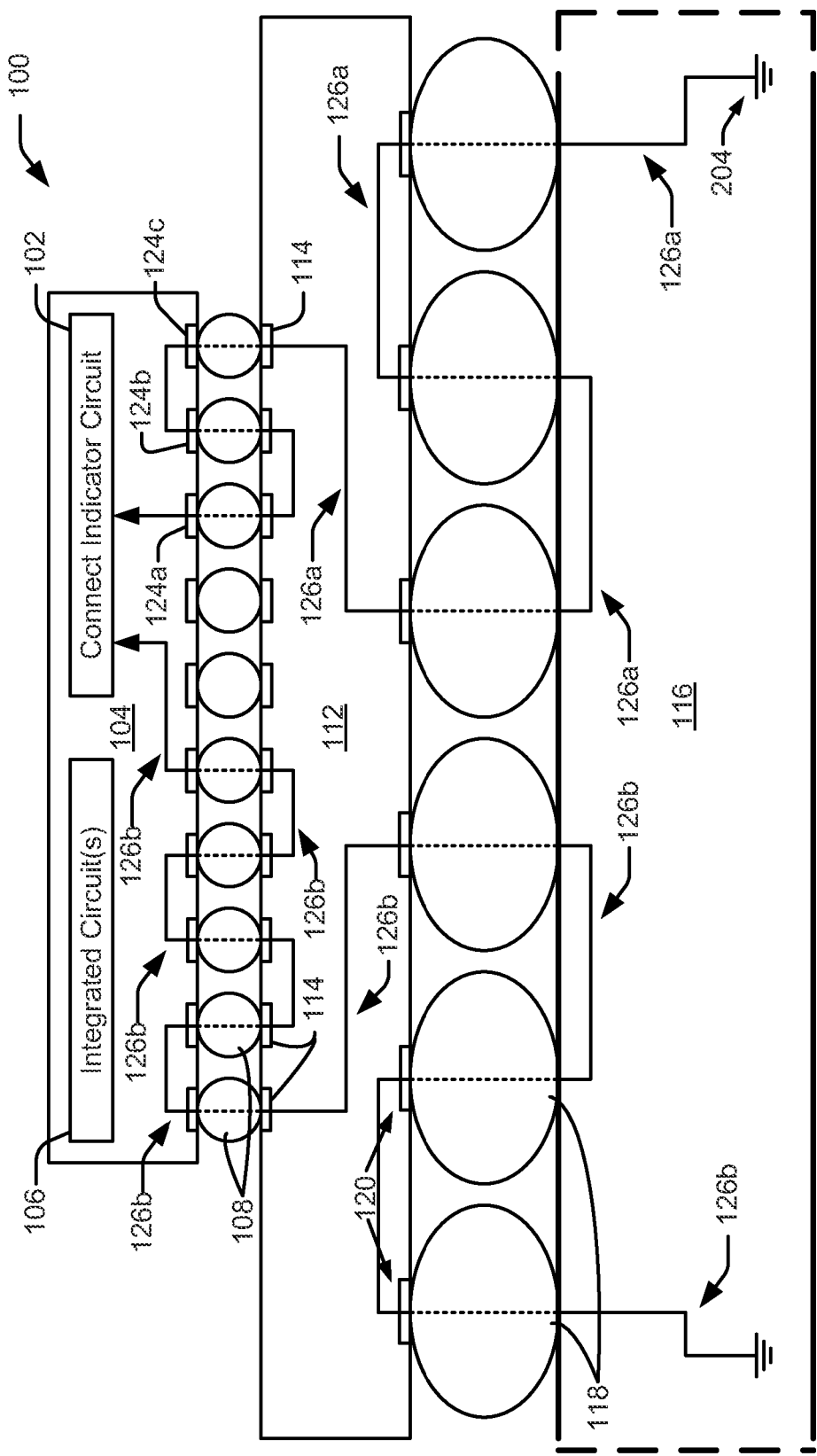
FIG. 6 shows another example of a die connection monitoring system according to an embodiment.
Figure 7:
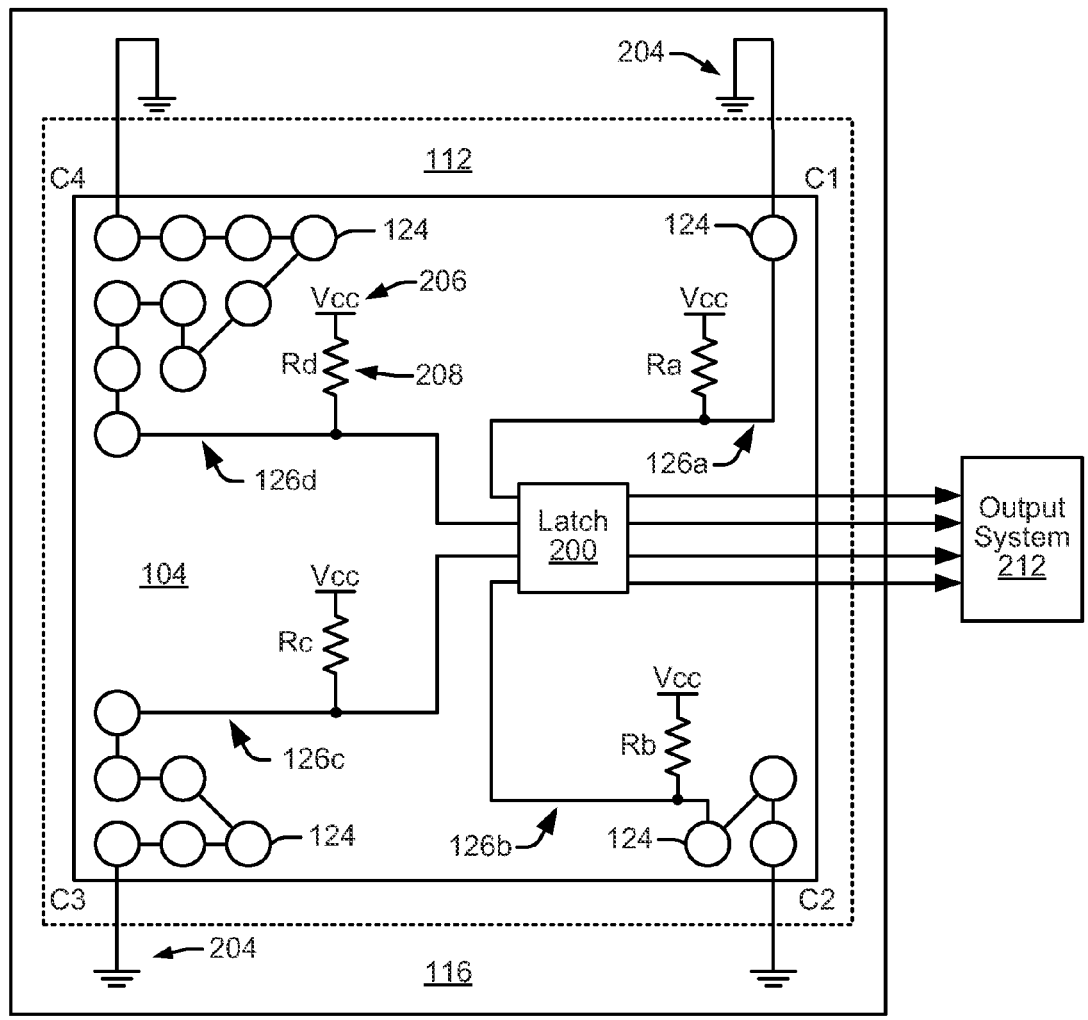
FIG. 7 shows another example of a die connection monitoring system according to an embodiment.

FIG. 6 illustrates an embodiment of a die connection monitoring system 100 in which a plurality of monitor pads 124 linked in series along different conductive paths 126a and 126b are monitored at the same time by connection indicator circuit 102 integrated onto flip-chip 104. FIG. 7 provides a fuller illustration of this and other embodiments by showing that any number of monitor pads 124 can be monitored along any number of conductive paths 126 (126a-126d) in any configuration by connection indicator circuit 102. In the embodiment illustrated in FIG. 7, various monitor pads 124 are disposed in different numbers and configurations on corners C1, C2, C3 and C4 of flip-chip 104. As previously noted, however, monitor pads 124 may just as readily be located anywhere on flip-chip 104 where mechanical, thermal, and/or other stresses are likely to cause breaks in solder joints between the flip-chip 104 and an underlying substrate such as BGA 112. Coupled to the monitor pads 124 along each conductive path 126a-126d, and to latch 200, are respective internal pull-up resistors Ra, Rb, Re and Rd. As in previous embodiments, each monitor pad 124 or series string of monitor pads 124 is grounded 204 to PCB 116 and coupled to respective internal pull-up resistors Ra, Rb, Re and Rd. It is noted, however, that the ground may be located other than on PCB 116.

In operation, if a monitor pad 124 along a particular conductive path 126a-126d fails, the circuit for that path will open and the signal at the input to the latch 200 for that path will be pulled up via a respective pull-up resistor Ra, Rb, Re and Rd, thereby changing the output state of latch 200 to indicate that a failure has occurred at the specific corner C1, C2, C3 or C4 (or other location being monitored) where the respective conductive path 126 and monitor pads 124 are disposed. Thus, in various embodiments, any number of monitor pads 124 in varying conductive path configurations can be monitored independently. Output system 212 receives the signal from latch 200 to indicate a failure of the monitor pads) along conductive paths 126a-126d, for example.

Figure 8:
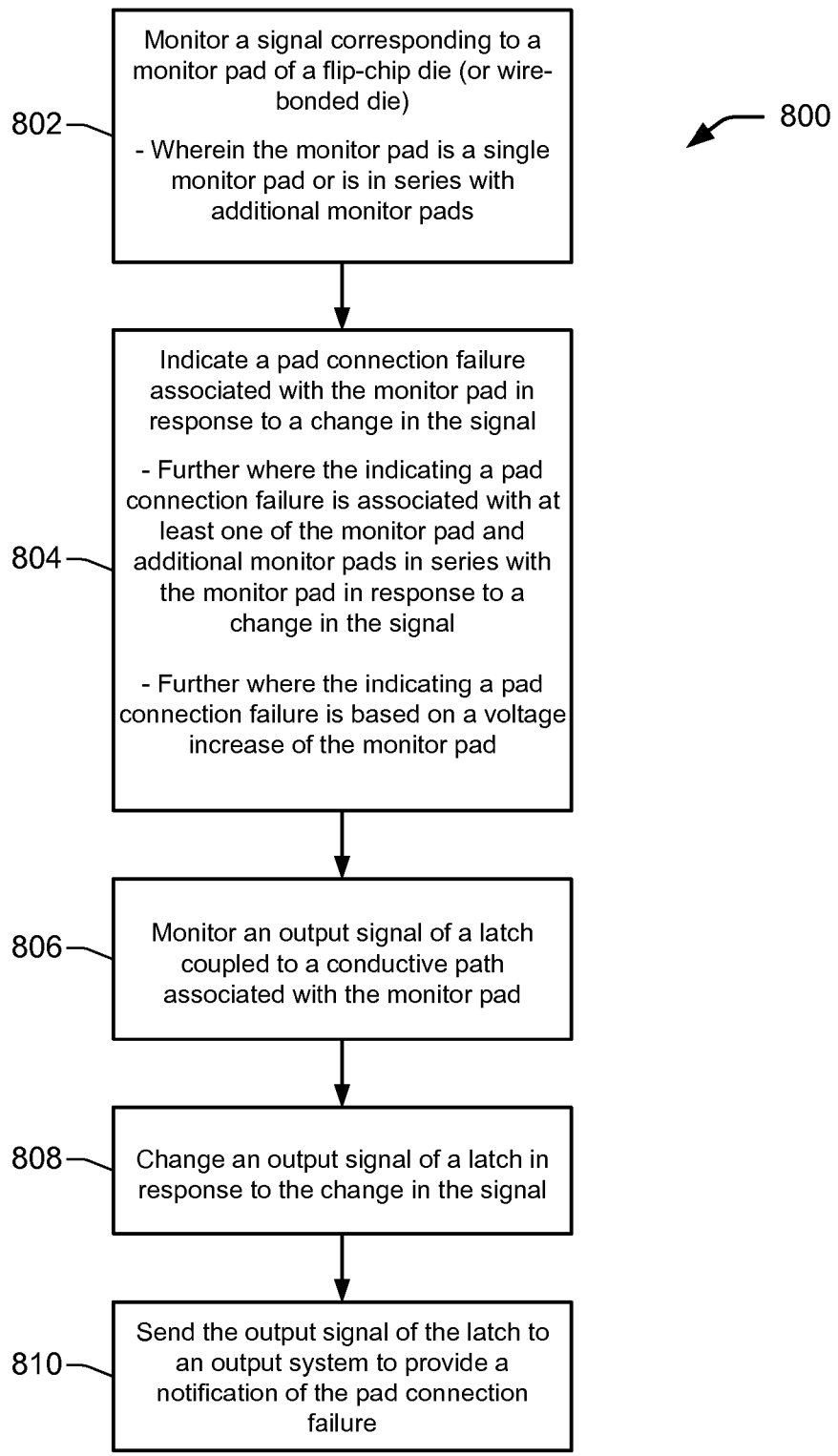
FIG. 8 shows a flowchart of a method of monitoring a die connection according to an embodiment.

FIG. 8 shows a flowchart of a method 800 of monitoring a die connection according to an embodiment. The method 800 is generally associated with embodiments of the die connection monitoring systems 100 discussed above with respect to FIGS. 1-7. Method 800 begins at block 802 with monitoring a signal corresponding to a monitor pad of a flip-chip die 104 (or a wire bonded die 130). The monitoring includes coupling the monitor pad to a latch. The monitor pad is also coupled to ground through the solder joint between the monitor pad and the BGA contact. The monitor pad is also coupled through a pull-up resistor to a voltage rail. Vcc, such that the voltage level of the monitor pad will change from ground potential to Vcc if the solder joint is broken. The monitor pad may also be coupled in series with additional monitor pads where a monitor pad on one end of the series is coupled to ground while a different monitor pad on the other end of the series is coupled to the latch and to Vcc through the pull-up resistor.

Method 800 continues at block 804 with indicating in response to a change in the signal, that a pad connection failure associated with the monitor pad has occurred. Where the monitor pad is in series with additional monitor pads, the indication of a pad connection failure is associated with at least one of the monitor pad and the additional monitor pads in response to the change in the signal. The indication of a pad connection failure is based on a voltage increase of the monitor pad which occurs when the connection to ground is broken anywhere along a conductive path between the monitor pad and ground.

Method 800 further includes monitoring an output signal of a latch coupled to a conductive path associated with the monitor pad, as shown at block 806. At block 808 of method 800, the output signal of a latch is changed in response to the change in the signal being monitored corresponding to the monitor pad of the die. At block 810, the output signal of the latch is sent to an output system (e.g., a computer device) to provide a notification of the pad connection failure.

What is claimed is:

1. A system for monitoring a die connection, comprising:
a die bonded to a substrate; and
a connection indicator circuit coupled to a monitor pad of the die and configured to detect a connection failure of the monitor pad,
the connection indicator circuit comprising a latch having an input coupled to a conductive path associated with the monitor pad and an output that changes state upon receiving an indication of the connection failure at the input, the output of the latch to be provided to an output system to provide notification of the connection failure.

2. The system of claim 1, wherein the die comprises:
an integrated circuit;
functional bond pads coupling the integrated circuit to substrate contacts; and
the connection indicator circuit functionally isolated from the integrated circuit.

3. The system of claim 1, wherein the connection indicator circuit comprises a ground potential connection to the monitor pad and a pull-up resistor coupled between the monitor pad and a power rail, and wherein the connection indicator circuit detects a connection failure when the ground potential connection is disrupted.

4. The system of claim 3, wherein the monitor pad is the first of n monitor pads of the die coupled in series and the pull-up resistor is coupled between the nth monitor pad and the power rail.

5. The system of claim 1, wherein the substrate comprises a ball grid array (BGA) and a connection failure occurs when the monitor pad becomes uncoupled from a BGA contact.

6. The system of claim 1, wherein the substrate comprises a ball grid array (BGA) having a BGA contact coupled to the monitor pad on a top side of the BGA and a printed circuit board (PCB) contact coupled to a PCB on a bottom side of the BGA, wherein the BGA contact is coupled to the PCB contact through the BGA and wherein a connection failure occurs when the PCB contact becomes uncoupled from the PCB.

7. The system of claim 1, wherein the die is selected from the group consisting of a flip-chip die and a wire-bonded die.

8. A method of monitoring a die connection, comprising:
monitoring a signal corresponding to a monitor pad of a die, including monitoring an output signal of a latch coupled to a conductive path associated with the monitor pad; and
indicating a pad connection failure associated with the monitor pad in response to a change in the signal corresponding to the monitor pad, including changing the output signal of the latch in response to the change in the signal corresponding to the monitor pad, and sending the output signal of the latch to an output system to provide a notification of the pad connection failure.

9. The method of claim 8, wherein the monitor pad is serially coupled to a plurality of additional monitor pads of the die, the method further comprising indicating a pad connection failure associated with at least one of the monitor pad and the additional monitor pads in response to a change in the signal.

10. The method of claim 8, further comprising indicating a pad connection failure based on a voltage increase of the monitor pad.

11. The method of claim 8, wherein the monitor pad is coupled to a voltage rail through a pull-up resistor on the die.

12. The method of claim 8, wherein the monitor pad is connected to a ground potential, the method further comprising detecting a pad connection failure when the ground potential connection is disrupted.

13. A system for monitoring a die connection, comprising:
a die bonded to a ball grid array (BGA);
the BGA bonded to a printed circuit board (PCB);
a monitor pad on the die coupled to ground through the BGA and coupled to a voltage rail through a pull-up resistor on the die;
a latch coupled to a conductive path associated with the monitor pad, the latch to store a connection failure indication of the monitor pad, and an output signal of the latch to change in response to a change in the connection failure indication; and
an output system to receive the output signal of the latch and provide notification of a connection failure of the monitor pad.

14. The system of claim 13, further comprising:
a first solder joint coupling the monitor pad to a first BGA contact;
a second solder joint coupling a second BGA contact to a ground connection on the PCB, wherein a connection failure occurs when either one or both of the first and second solder joints fail, causing a disruption in the ground connection.

15. The system of claim 13, wherein the monitor pad comprises a plurality of monitor pads coupled in series, and wherein a first monitor pad in the series is coupled to the voltage rail through the pull-up resistor and a last monitor pad in the series is coupled to ground through the BGA, and the latch stores a connection failure indication of any of the plurality of monitor pads.

* * * * *